(12) United States Patent
Lue et al.

(10) Patent No.: US 7,463,530 B2
(45) Date of Patent: Dec. 9, 2008

(54) OPERATING METHOD OF NON-VOLATILE MEMORY DEVICE

(75) Inventors: Hang-Ting Lue, Hsinchu (TW); Erh-Kun Lai, Hsinchu (TW); Szu-Yu Wang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 242 days.

(21) Appl. No.: 11/554,455

(22) Filed: Oct. 30, 2006

(65) Prior Publication Data
US 2007/0290273 A1    Dec. 20, 2007

(30) Foreign Application Priority Data
Jun. 20, 2006    (TW)    ............... 95122001 A

(51) Int. Cl.
G11C 11/34    (2006.01)
(52) U.S. Cl. .................. 365/185.24; 365/185.28
(58) Field of Classification Search .......... 365/185.24, 365/185.28, 185.29
See application file for complete search history.

(56) References Cited

U.S. PATENT DOCUMENTS

| | | | |
|---|---|---|---|
| 5,286,994 A | 2/1994 | Ozawa et al. | |
| 5,319,229 A | 6/1994 | Shimoji et al. | |
| 5,587,947 A * | 12/1996 | Chang et al. | 365/185.3 |
| 5,940,325 A * | 8/1999 | Chang et al. | 365/185.28 |
| 5,952,692 A | 9/1999 | Nakazato et al. | |
| 6,011,725 A | 1/2000 | Eitan et al. | |
| 6,026,026 A | 2/2000 | Chan et al. | |
| 6,074,917 A | 6/2000 | Chang et al. | |
| 6,169,693 B1 | 1/2001 | Chan et al. | |
| 6,218,700 B1 | 4/2001 | Papadas et al. | |
| 6,512,696 B1 | 1/2003 | Fan et al. | |

(Continued)

FOREIGN PATENT DOCUMENTS

EP    0016246    10/1980

(Continued)

OTHER PUBLICATIONS

White et al., "On the Go with SONOS" IEEE Circuits and Devices, Jul. 2000, 22-31.

(Continued)

*Primary Examiner*—Anh Phung
(74) *Attorney, Agent, or Firm*—Haynes Beffel & Wolfeld LLP

(57) ABSTRACT

An operating method of non-volatile memory device is provided. The device includes memory cells having a semiconductor substrate, a stack layer, and source and drain regions disposed below a surface of the substrate and separated by a channel region. The stack layer includes an insulating layer disposed on the channel region, a charge storage layer disposed on the insulating layer, a multi-layer tunneling dielectric structure on the charge storage layer, and a gate disposed on the multi-layer tunneling dielectric structure. A negative bias is supplied to the gate to inject electrons into the charge storage layer through the multi-layer tunneling dielectric structure by −FN tunneling so that the threshold voltage of the device is increased. A positive bias is supplied to the gate to inject holes into the charge storage layer through the multi-layer tunneling dielectric structure by +FN tunneling so that the threshold voltage of the device is decreased.

18 Claims, 15 Drawing Sheets

U.S. PATENT DOCUMENTS

| | | | |
|---|---|---|---|
| 6,709,928 | B1 | 3/2004 | Jenne et al. |
| 6,720,630 | B2 | 4/2004 | Mandelman et al. |
| 6,744,675 | B1* | 6/2004 | Zheng et al. ............ 365/185.28 |
| 6,784,480 | B2 | 8/2004 | Bhattacharyya |
| 6,818,558 | B1 | 11/2004 | Rathor et al. |
| 6,897,533 | B1 | 5/2005 | Yang et al. |
| 6,912,163 | B2 | 6/2005 | Zheng et al. |
| 7,075,828 | B2 | 7/2006 | Lue et al. |
| 7,115,469 | B1 | 10/2006 | Halliyal et al. |
| 7,115,942 | B2 | 10/2006 | Wang |
| 7,133,313 | B2 | 11/2006 | Shih et al. |
| 7,151,692 | B2 | 12/2006 | Wu et al. |
| 7,164,603 | B2 | 1/2007 | Shih et al. |
| 7,190,614 | B2 | 3/2007 | Wu et al. |
| 7,209,390 | B2 | 4/2007 | Lue et al. |
| 7,394,702 | B2* | 7/2008 | Ding et al. ............. 365/185.29 |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0146465 | A1 | 8/2003 | Wu |
| 2003/0224564 | A1 | 12/2003 | Kang et al. |
| 2004/0079983 | A1 | 4/2004 | Chae et al. |
| 2004/0183126 | A1 | 9/2004 | Bae et al. |
| 2005/0006696 | A1 | 1/2005 | Noguchi et al. |
| 2005/0023603 | A1 | 2/2005 | Eldridge et al. |
| 2005/0074937 | A1 | 4/2005 | Jung |
| 2005/0093054 | A1 | 5/2005 | Jung |
| 2005/0219906 | A1 | 10/2005 | Wu |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0270849 | A1 | 12/2005 | Lue |
| 2005/0281085 | A1 | 12/2005 | Wu |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0258090 | A1 | 11/2006 | Bhattacharyya et al. |
| 2006/0261401 | A1 | 11/2006 | Bhattacharyya |
| 2006/0281260 | A1 | 12/2006 | Lue |
| 2007/0012988 | A1 | 1/2007 | Bhattacharyya |
| 2007/0029625 | A1 | 2/2007 | Lue et al. |
| 2007/0031999 | A1 | 2/2007 | Ho et al. |
| 2007/0045718 | A1 | 3/2007 | Bhattacharyya |
| 2007/0069283 | A1 | 3/2007 | Shih et al. |

FOREIGN PATENT DOCUMENTS

| | | |
|---|---|---|
| EP | 1411555 | 4/2004 |
| JP | 2004363329 | 12/2004 |

OTHER PUBLICATIONS

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38(11) Nov. 1991 2519-2526.

Ito et al., "A Novel MNOS Technology Using Gate Hole Injection in Erase Operation for Embedded Nonvolatile Memory Applications," 2004 Symp. on VLSI Tech Digest of Tech Papers 2004, 80-81.

Eitan et al., "NROM: A Novel Localized Trapping, 2-Bit Nonvolatile Memory Cell," IEEE Electron Device Lett 21(11) Nov. 2000, 543-545.

Chindalore et al., "A New Combination-Erase Technique for Erasing Nitride Based (SONOS) Nonvolatile Memories," IEEE Electron Dev Lett 24(4) Apr. 2003, 257-259.

Dimaria, D.J., et al., "Conduction Studies in Silicon Nitride: Dark Currents and Photocurrents," IBM J. Res. Dev. May 1977, 227-244.

Yeh, C.C., et al., "PHINES: A Novel Low Power Program/Erase, Small Pitch, 2-Bit per Cell Flash Memory," IEDM Tech Digest 2002, 931-934.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin $HfO_2$ ($ZrO_2$) layers sandwiched between thicker $SiO_2$ Layers," Surface Science Sep. 20, 2004, vol. 566-568, 1185-1189.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Takata, M., et al., "New Non-Volatile Memory with Extremely High Density Metal Nano-Dots," IEEE IEDM 03-553, 22.5.1-22.5.4.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4.

Baik, Seung, et al., "High Speed and Nonvolatile Si Nanocrystal Memory for Scaled Flash Technology using Highly Field-Sensitive Tunnel Barrier," IEEE IEDM 03-545, 22.3.1-22.3.4.

Lee, Chang, et al., "A Novel SONOS Structure of SiO2/SiN/Al2O3 with TaN Metal Gate for Multi-Giga Bit Flash Memeries," IEEE 2003, 4 pages.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Shih et al., "A Novel 2-bit/cell Nitride Storage Flash memory with Greater than 1M P/E-cycle Endurance," IEEE IEDM 2004, pp. 36.3.1-36.3.4.

Blomme, et al., "Multilayer tunneling barriers for nonvolatile memory applications," 60th Device Resarch Conf., 2002, Conf. Digest 153-154.

Blomme, et al., Write/Erase Cycling Endurance of Memory Cells with SiO2/HfO2 Tunnel Dielectric, IEEE Trans on Device and Materials Reliability, vol. 4, No. 3, Sep. 2004, 345-351.

Govoreanu, et al, "VARIOT: A Novel Multilayer Tunnel Barrier Concept for Low-Voltage Nonvolatile Memory Devices," IEEE Electron Device Lett., vol. 24, No. 2, Feb. 2003, 99-101.

Govoreanu et al., "Simulation of Nanofloating Gate Memory with High-k Stacked Dielectrics," IEEE SISPAD Int'l Conf. 305 Sep. 2003, 299-302.

Govoreanu et al., "An Investigation of the Electron Tunneling Leakage Current through Ultrathin Oxides/High-k Gate Stacks at Inversion Conditions," IEEE SISPAD Int'l Conf. Sep. 3-5, 2003, 287-290.

Kim et al., "Robust Multi-bit Programmable Flash Memory Using a Resonant Tunnel Barrier," Electron Dev. Mtg. Dec. 5-7, 2005, IEDM Tech Dig. 861-864.

Likharev, "Layered tunnel barriers for nonvolatile memory devices," Applied Physics Lett, vol. 73, No. 15, Oct. 1998, 2137-2139.

Lue et al., "BE-SONOS: A Bandgap Engineered SONOS with Excellent Performance and Reliability," IEDM Tech Digest, IEEE Int'l Dec. 2005, 547-550.

Sune, et al., "Multi-layer SONOS with Direct Tunnel Oxide for High Speed and Long Retention Time," IEEE 2002 Nanoelectronics Workshop, Jun. 2002, 83-84.

Aminzadeh et al., "Conduction and Charge Trapping in Polysilicon-Silicon Nitride-Oxide-Silicon Structures under Positive Gate Bias," IEEE Transactions on Electron Devices, vol. 35, No. 4, Apr. 1998, 459-467.

Yamada, et al., "A self-convergence erasing scheme for a simple stacked gate flash EEPROM," Proc. of the Int'l Electron Dev. Mtg., IEEE Dec. 1991, 307-310.

Lue et al., "A Novel P-Channel NAND-Type Flash memory with 2-bit/cell Operation and High Programming Throughput (>20 MB/sec)," IEEE 2005, 4 pages.

\* cited by examiner

OPERATING METHOD OF NON-VOLATILE MEMORY DEVICE

CROSS-REFERENCE TO RELATED APPLICATION

This application claims the priority benefit of Taiwan application serial no. 95122001, filed Jun. 20, 2006. All disclosure of the Taiwan application is incorporated herein by reference.

BACKGROUND OF THE INVENTION

1. Field of the Invention

The present invention relates to an operating method of a memory device. More particularly, the present invention relates to an operating method of a non-volatile memory device.

2. Description of Related Art

Non-volatile memory (NVM) is a semiconductor memory which can continue to store data after power is turned off. NVM includes mask read-only memory (Mask ROM), programmable read-only memory (PROM), erasable programmable read-only memory (EPROM), electrically erasable programmable read-only memory (EEPROM), and flash memory. NVM has been broadly applied in semiconductor industry and is a memory researched and developed for preventing program data loss. Generally, NVM can be programmed, read, and/or erased based on the eventual application requirement of a device and can store program data for long time.

Flash memory generally includes a memory cell array arranged in columns and rows. Each memory cell includes a MOS transistor having a gate, a drain, a source, and a channel between the drain and the source. The gate corresponds to a word line, and the drain/source correspond to bit lines of the memory array. Presently the gate of flash memory is usually double gate structure including a gate and a floating gate, wherein the floating gate is disposed between two dielectric layers for trapping carriers such as electrons, so as to "program" the memory cell. In other words, in conventional memory cell, the tunneling oxidation layer is disposed on the channel, the floating gate is disposed on the tunneling oxidation layer, the inter-gate dielectric layer is disposed on the floating gate, and the gate is disposed on the inter-gate dielectric layer.

When programming is performed, a set of programming biases are supplied to the selected word line and bit line. Biases are supplied to one or multiple memory cells corresponding to the selected word line and bit line in programming state. As to a single memory cell, different biases are supplied to the source and the drain thereof so that electric field is formed along the channel thereof, accordingly electrons gain enough power to tunnel the first dielectric layer to enter the floating gate and to be stored therein. Electrons are stored in the floating gate and accordingly the threshold voltage of the memory cell is changed, thus, whether the memory cell has been programmed can be known from the change of the threshold voltage thereof.

Read bias is supplied to a memory cell to read the memory cell, and the current passing through the memory cell is read by a sensing component. If the memory cell is programmed or electrons are stored in the floating gate thereof, then the quantity of the current thereof is different from the currents of those unprogrammed memory cells. Accordingly, the state of each memory cell can be obtained by the sensing component through the quantity of the current of the memory cell.

To erase information in a flash memory cell, erase bias has to be supplied to the memory cell to force electrons stored in the floating gate of the memory cell to tunnel out of the floating gate of the memory cell by known mechanism such as Fowler-Nordheim (FN) tunneling.

In a present NVM, the tunneling oxidation layer is disposed on the channel so that the bird beak effect caused by shallow trench isolation structure affects the tunneling oxidation layer severely, thus, the device cannot be minimized. On the other hand, high voltage is required by the electron tunneling programming or erasing operation of the present NVM, thus, the power consumption of the device is high, and the speed of performing the operations needs to be improved.

Accordingly, an operating method of memory cell which can resolve the aforementioned problems is required in memory cell design and in the technology of memory cell array devices.

SUMMARY OF THE INVENTION

Accordingly, the present invention is directed to provide an operating method of a memory device, wherein the reliability of the memory device is not affected by bird beak effect caused by shallow trench isolation structure and the operation speed thereof is very fast.

The present invention provides an operating method of memory device, wherein the memory device includes a substrate and a plurality of memory cells disposed on the substrate. Each memory cell includes a gate, a source region, a drain region, a channel region defined between the source and the drain region, a charge storage layer disposed on the channel region, a multi-layer tunneling dielectric structure between the charge storage layer and the gate, and an insulating layer between the charge storage layer and the channel region. A first operation is performed by supplying a negative bias to the gate and setting the source/drain regions floating, grounded, or as 0V so that electrons are injected from the gate of the memory cell into the charge storage layer through the multi-layer tunneling dielectric structure by −FN tunneling, which results in the increasing of the threshold voltage of the memory cell. A second operation is performed by supplying a positive bias to the gate and setting the source/drain regions floating, grounded, or as 0V so that holes are injected from the gate of the memory cell into the charge storage layer through the multi-layer tunneling dielectric structure by +FN tunneling, which results in the decreasing of the threshold voltage of the memory cell.

According to an embodiment of the present invention, the negative bias is about −16 to about −20V, and the positive bias is about 14 to about 16V.

According to an embodiment of the present invention, the source/drain regions are p-type conductive, and the first operation is a programmed operation and the second operation is an erasing operation.

According to an embodiment of the present invention, the source/drain regions are n-type conductive, and the first operation is an erasing operation and the second operation is a programmed operation.

According to an embodiment of the present invention, the multi-layer tunneling dielectric structure includes an oxide/nitride/oxide layer.

According to an embodiment of the present invention, the multi-layer tunneling dielectric structure includes a silicon oxide/silicon nitride/silicon oxide layer or a silicon oxide/aluminum oxide/silicon oxide layer.

According to an embodiment of the present invention, the material of the insulating layer includes silicon oxide or aluminum oxide.

According to an embodiment of the present invention, the material of the charge storage layer includes silicon nitride, SiON, $HfO_2$, $HfSi_xO_y$, or $Al_2O_3$.

The present invention provides an operating method for a memory device. The memory device includes a first type conductive substrate and a plurality of memory cells disposed thereon. Each memory cell includes a gate, a source region, a drain region, a channel region disposed between the source region and the drain region, a charge storage layer disposed on the channel region, a multi-layer tunneling dielectric structure between the charge storage layer and the gate, and an insulating layer between the charge storage layer and the channel region. The gate corresponds to a word line, the source region corresponds to a first bit line, and the drain region corresponds to a second bit line. When a first operation is performed, a negative bias is supplied to the word line corresponding to the memory cell, and the first and the second bit lines corresponding to the memory cell are set to be floating, grounded, or 0V, so that electrons tunnel to the charge storage layer from the gate of the memory cell through the multi-layer tunneling dielectric structure by −FN tunneling, which results in the increasing of the threshold voltage of the memory cell. When a second operation is performed, a positive bias is supplied to the word line corresponding to the memory cell, and the first and the second bit lines are set to be floating, grounded, or 0V, so that holes tunnel to the charge storage layer from the gate of the memory cell through the multi-layer tunneling dielectric structure, which results in the decreasing of the threshold voltage of the memory cell.

According to an embodiment of the present invention, the negative bias is about −16 to about −20V, and the positive bias is about 14 to about 16V.

According to an embodiment of the present invention, the source/drain regions are p-type conductive, and the first operation is a programmed operation and the second operation is an erasing operation.

According to an embodiment of the present invention, the source/drain regions are n-type conductive, and the first operation is an erasing operation and the second operation is a programmed operation.

According to an embodiment of the present invention, the multi-layer tunneling dielectric structure includes an oxide/nitride/oxide (ONO) layer.

According to an embodiment of the present invention, the multi-layer tunneling dielectric structure includes a silicon oxide/silicon nitride/silicon oxide layer or a silicon oxide/aluminum oxide/silicon oxide layer.

According to an embodiment of the present invention, the material of the insulating layer includes silicon oxide or aluminum oxide.

According to an embodiment of the present invention, the material of the charge storage layer includes silicon nitride, SiON, $HfO_2$, or $HfSi_xO_y$.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
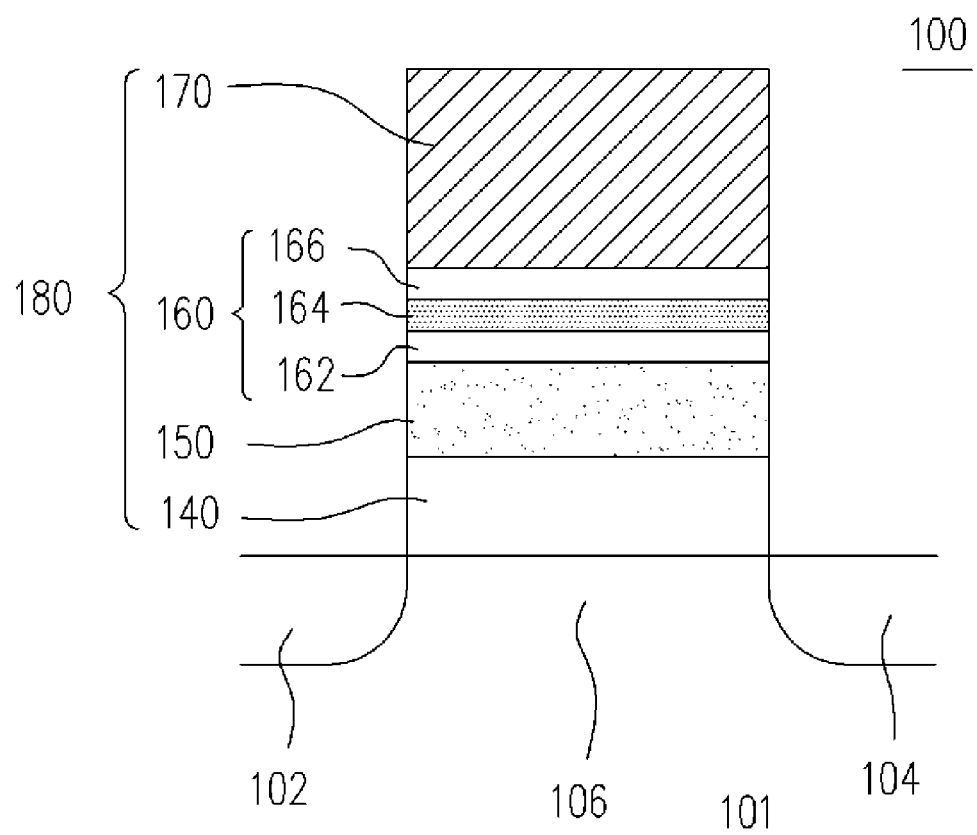
FIG. 1 is a cross-sectional view of a memory cell according to an embodiment of the present invention.

Herein the present invention and the exemplary embodiments thereof will be explained in detail with reference to the figures. It should be noted that the figures represent very simplified formats of the embodiments and are not drawn to accurate proportions. Wherever possible, like reference numerals refer to the like elements in all the figures. According to the present disclosure, the direction terms used in the figures, such as top, bottom, left, right, up, down, on, below, under, in front, and behind are used referring to the figures for the convenience of understanding. Such direction terms along with the descriptions to the figures should not be understood as limitations unmentioned in following claims to the scope of the present invention. It should be understood that even the present disclosure is explained with reference to some explanatory embodiments, such embodiments are not for limiting the scope of the present invention, and moreover, the processes and structures described in the present disclosure do not contain the complete fabricating flow of IC, instead, the present invention can be implemented with various existing or evolving IC fabricating technologies in the art.

The present invention provides a method for performing programming or erasing operation of a memory cell, wherein electrons/holes are injected from the gate of a memory cell into the charge storage layer by −FN/+FN tunneling so as to increase/decrease the threshold voltage of the memory cell. The memory device may include a memory array containing p-channel/n-channel memory cells. The memory array includes NAND constructed p-channel/n-channel NVM cells, and the memory operated with the method provided by the present invention can be applied to flash memory and has very good programming performance.

FIG. 1 illustrates the structure of a memory cell 100 according to an exemplary embodiment of the present invention. Referring to FIG. 1, a semiconductor substrate 101 having two diffusion regions 102 and 104 is provided. The semiconductor substrate 101 may include any existing semiconductor material, such as silicon. In an embodiment, the semiconductor substrate 101 is n-type conductive, while the diffusion regions 102 and 104 are p-type conductive. In another embodiment, the semiconductor substrate 101 is p-type conductive, while the diffusion regions 102 and 104 are n-type conductive. In an embodiment, the semiconductor substrate 101 is p-type conductive and an n-type conductive well (not shown) has been formed in the substrate 101; the diffusion regions 102 and 104 are p-type conductive and are formed in the n-type well. In another embodiment, the substrate 101 is n-type conductive and a p-type conductive well (not shown) has been formed in the substrate 101; the diffusion regions 102 and 104 are n-type conductive and are formed in the p-type conductive well. The semiconductor substrate 101 between the diffusion regions 102 and 104 is channel region 106. A stack layer 180 is disposed on the channel region 106. The stack layer 180 includes an insulating layer 140, a charge storage layer 150, a multi-layer tunneling dielectric structure 160, and a gate 170. Preferably the insulating layer 140 includes silicon dioxide. Preferably the charge storage layer 150 includes a layer of charge trapping material such as silicon nitride. The multi-layer tunneling dielectric structure 160 includes a first tunneling dielectric layer 162, a small hole tunneling barrier height layer 164, and a second tunneling dielectric layer 166. The small hole tunneling barrier height layer 164 is a material layer whose hole tunneling barrier value is smaller than or approximate to that of silicon dioxide. Preferably the material of the small hole tunneling barrier is material which is smaller than or equal to 4.5 eV. More preferably the material of the small hole tunneling barrier is material which is smaller than or equal to 1.9 eV. A preferable multi-layer tunneling dielectric structure 160 may include ultra-thin oxide-nitride-oxide (ONO) structure. The gate 170 may include polysilicon, metal, metal silicide, or the combination thereof. The memory device 100 includes diffusion regions 102, 104 and a gate 170 to form a MOS transistor, wherein the diffusion regions 102 and 104 are used as the source/drain regions of the MOS transistor.

According to the present invention, a memory cell includes a semiconductor substrate 101. Any substrate material suitable for semiconductor device can be used. In exemplary embodiments of the present invention, the semiconductor substrate 101 includes silicon material. Silicon wafer prepared through standard technology can be used as the substrate 101. For example, suitable silicon chip can be fabricated with following technology: growing silicon from a small crystal referred to as seed; withdrawing slowly from melted hyper pure silicon in a rotary way to produce a columnar crystal; then slicing the columnar crystal into thin plates; and grinding, polishing (as smooth as mirror), and cleaning the sliced thin plates.

The semiconductor substrate 101 includes first conductive silicon such as n-type conductive silicon or p-type conductive silicon. Generally speaking, the first conductive silicon substrate adopted in an exemplary embodiment of the present invention is silicon wafer having light first conductive dopant. In the present invention, the source/drain regions are p+ or n+ doped regions, the substrate of light first conductive dopant is advantageous to programming and reading a memory cell due to the reversed bias of PN junction. The first conductive dopant of semiconductor substrate such as silicon can be achieved by any suitable method, for example, by implanting element such as arsenic, phosphor or nitrogen, or other element. Preferably, a dose between $10^{14}/cm^3$ and $10^{18}/cm^3$ of first conductive dopant is doped into the substrate. More preferably, a dose between $10^{16}/cm^3$ and $10^{17}/cm^3$ of first conductive dopant is doped into the substrate.

The insulating layer 140, the charge storage layer 150, the multi-layer tunneling dielectric structure 160, and the gate 170 may be disposed at least on the channel region 106 of the substrate 101.

The material of the insulating layer 140 may be silicon oxide or aluminum oxide, and the thickness thereof is between 30 Å and 100 Å. In an embodiment, the insulating layer 140 is a silicon oxide layer of about 54 Å or more. The method for forming the silicon oxide layer may be thermal oxidation.

The material of the charge storage layer 150 is, for example, silicon nitride, SiON, $HfO_2$, $HfSi_xO_y$, or $Al_2O_3$, and the thickness thereof is between about 30 Å and about 100 Å. In an embodiment, the charge storage layer 150 is a silicon nitride layer of about 80 Å. The method for forming the silicon nitride layer may be low pressure chemical vapor deposition.

The multi-layer tunneling dielectric structure 160 allows holes to tunnel from the gate 170 to the charge storage layer 150 when erasing/programming is performed to the memory device. In the non-volatile memory cell of the present invention, the charge trapping performance of the multi-layer tunneling dielectric structure 160 can be almost ignored, preferably, won't trap charges during memory operations. The multi-layer tunneling dielectric structure 160 includes, preferably, a small hole tunneling barrier height layer 164 and a first tunneling dielectric layer 162 and a second tunneling dielectric layer 166 sandwiching the small hole tunneling barrier height layer 164. Here the material of the small hole tunneling barrier height layer 164 is suitable dielectric material, for example, silicon nitride or silicon oxide, which allows tunneling when electric field exists, while which can prevent direct tunneling when no bias is supplied and can be deposited thin enough so that itself wont' become a charge trapping layer. The valence band energy levels of the materials of the first tunneling dielectric layer 162 and the second tunneling dielectric layer 166 are greater than the valence band energy level of the small hole tunneling barrier height layer 164, and the conduction band energy levels of the materials of the first tunneling dielectric layer 162 and the second tunneling dielectric layer 166 are smaller than the conduction band energy level of the small hole tunneling barrier height layer 164. In some exemplary embodiments of the present invention, the small hole tunneling barrier height layer 164 is, for example, nitride layer such as silicon nitride layer, and the first tunneling dielectric layer 162 and the second tunneling dielectric layer 166 sandwiching the small hole tunneling barrier height layer 164 are, for example, oxide layer such as silicon oxide layer, that is, the multi-layer tunneling dielectric structure 160 includes ONO structure. Generally, the hole barrier of silicon nitride is very low (about 1.9 eV), so that the holes may penetrate under high electric field. Meanwhile, the total thickness of the tunneling dielectric layer, such as the ONO structure, can prevent direct tunneling of electrons under low electric field. In an embodiment, such function allows the memory device not only to provide fast hole tunneling erasing but also reducing or removing charge leakage during the reservation period.

In some exemplary embodiments of the present invention, the thickness of the first tunneling dielectric layer 162 in the tunneling dielectric structure 160 is between about 10 Å and about 30 Å, the thickness of the small hole tunneling barrier height layer 164 is between about 15 Å and about 30 Å, and the thickness of the second tunneling dielectric layer 166 is between 8 Å and 30 Å. In an particular embodiment, the tunneling dielectric structure 160 has three-layer structure as bottom silicon oxide layer/middle silicon nitride layer/top silicon oxide layer (O/N/O), wherein the thickness of the bottom silicon oxide layer is about 20 Å, the thickness of the middle silicon nitride layer is about 25 Å, and the thickness of the top silicon oxide layer is about 15 Å.

The multi-layer tunneling dielectric structure 160 can be fabricated by many means. In a particular embodiment, the multi-layer tunneling dielectric structure 160 has bottom silicon oxide layer/middle silicon nitride layer/top silicon oxide layer (O/N/O), wherein the bottom silicon oxide layer can be formed with any conventional oxidation method including thermal oxidation, free radical oxidation such as in situ steam generation (ISSG), plasma oxidation, and chemical vapor deposition, however the formation method of the bottom silicon oxide layer is not limited hereto. The middle silicon nitride layer can be formed through chemical vapor deposition, or, by nitridation extra bottom silicon oxide layer with plasma. The top silicon oxide layer can be formed by oxidation or chemical vapor deposition.

For the gate material, poly-silicon material is preferred. Both n-type and p-type poly gate with a moderate doping density around $1 \times 10^{19}$ to $1 \times 10^{20}$ (cm$^{-3}$) is suitable for this device operation.

Any existing method or method being developed can be used for depositing or forming the tunneling dielectric layer, the charge storage layer, and/or the insulating layer with the foregoing film layers of suitable materials. The suitable methods include, for example, thermal generation and chemical vapor deposition.

Figure 2:
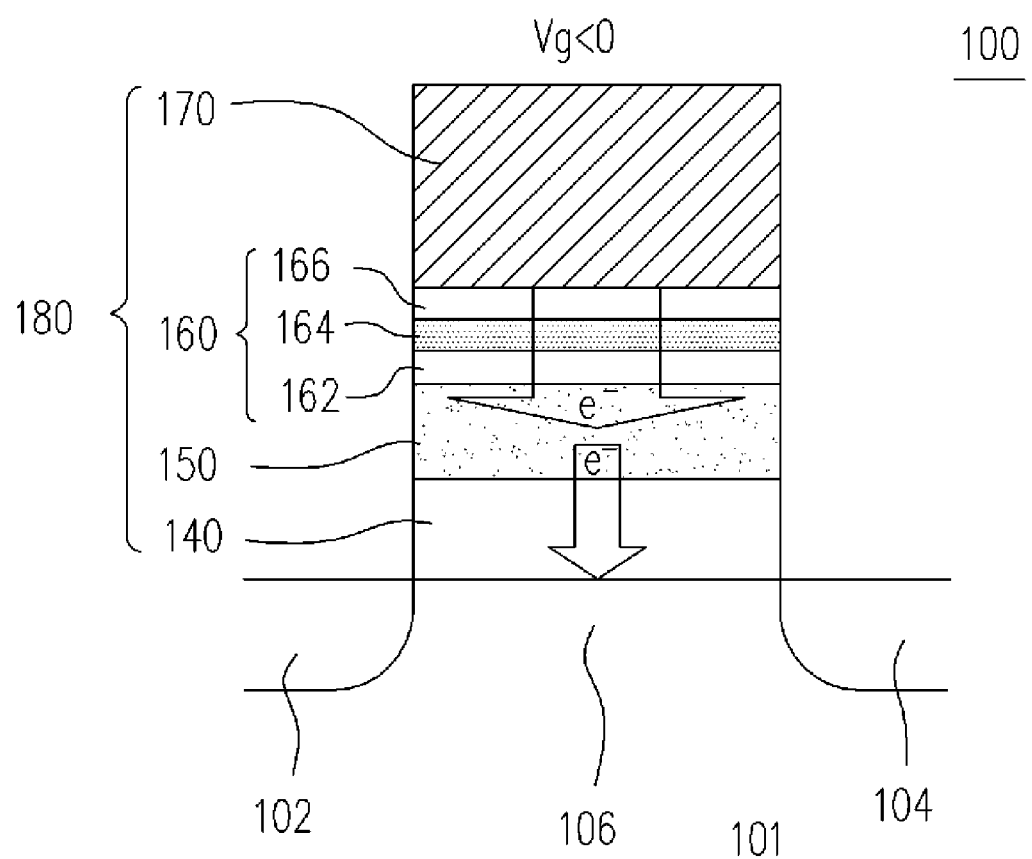
FIG. 2 is a cross-sectional view illustrating a memory cell performing −FN operation according to an embodiment of the present invention.
Figure 3:
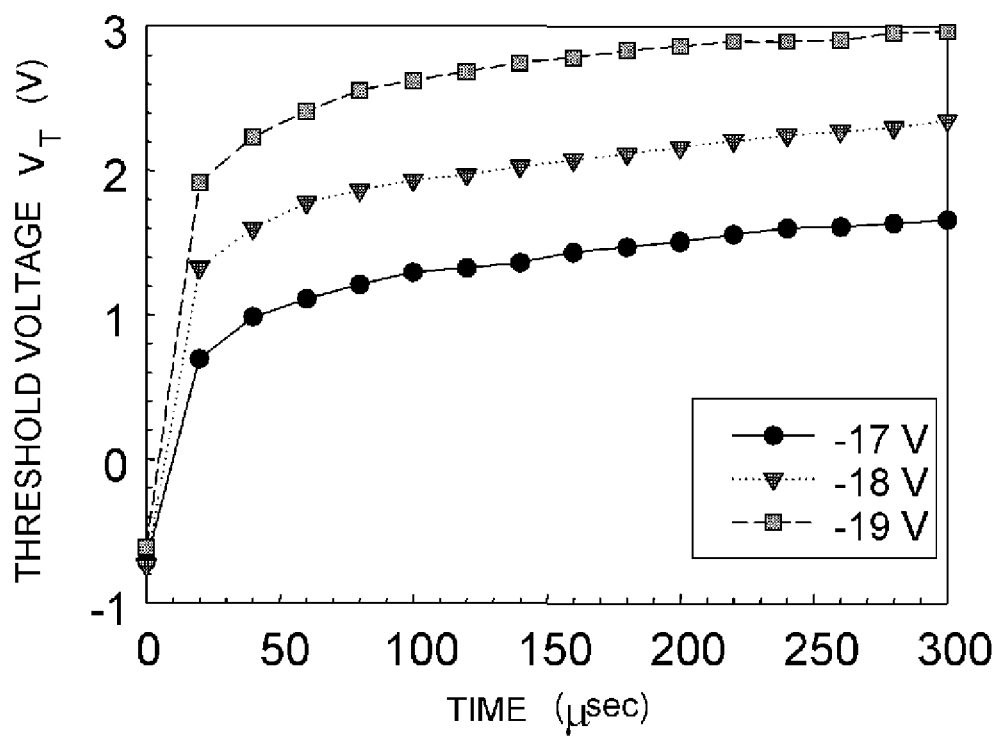
FIG. 3 is a diagram illustrating the relationship between threshold voltage and time when a memory cell is performing −FN operation according to an embodiment of the present invention.

Referring to FIG. 2 and FIG. 3, a negative bias is supplied to the gate 170 of the memory device 100 and the source/drain regions 102 and 104 are set to be floating, grounded, or 0V, so that electrons inject from the gate 170 of the memory device into the charge storage layer 150 through the multi-layer tunneling dielectric structure 160 by −FN tunneling to increase the threshold voltage of the memory device. Along with the increase of time, some electrons cannot be trapped in the charge storage layer 150 and pass through the insulating layer 140, thus, the threshold voltage of the memory device is saturated instead of increasing drastically. The results shown in FIG. 3 are results of respectively supplying −17V, −18V, and −19V to the gate 170 and setting the source/drain regions 102 and 104 to be 0V. The results in FIG. 3 show that all three different negative biases supplied cause the threshold voltage to increase and to saturate after some time.

Figure 4:
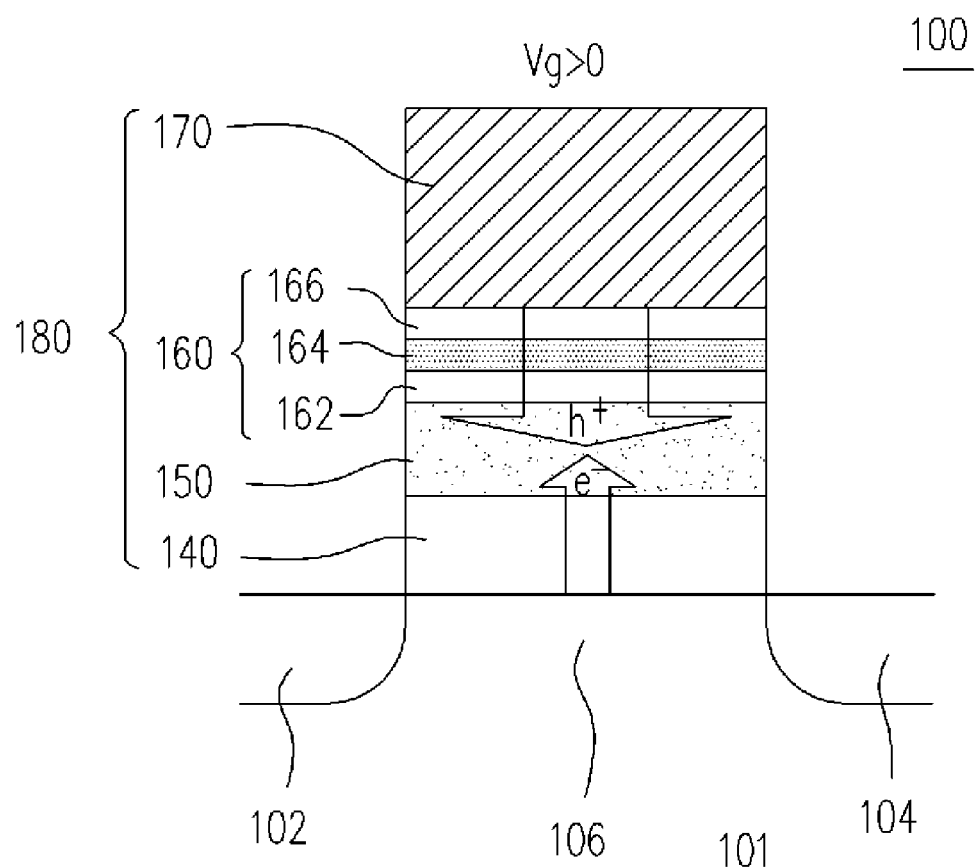
FIG. 4 is a cross-sectional view illustrating a memory cell performing +FN operation according to an embodiment of the present invention.
Figure 5:
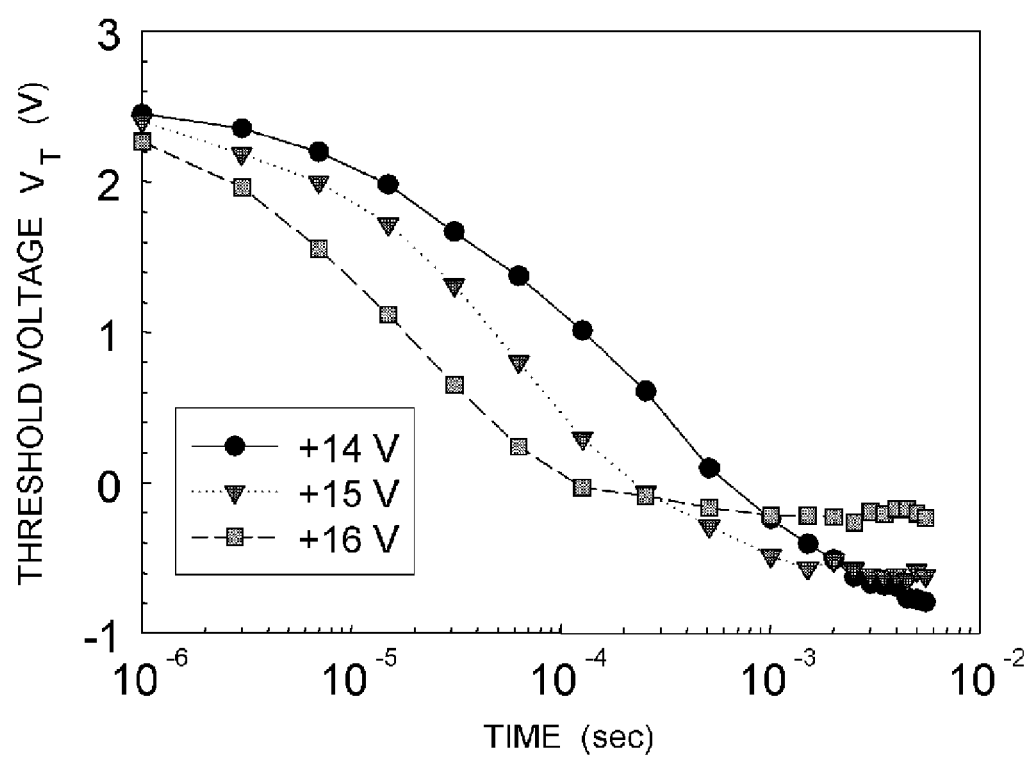
FIG. 5 is a diagram illustrating the relationship between threshold voltage and time when a memory cell is performing +FN operation according to an embodiment of the present invention.

Referring to FIG. 4 and FIG. 5, a positive bias is supplied to the gate 170 of the memory device, and the source/drain regions 102 and 104 are set to be floating, grounded, or 0V, so that holes inject from the gate 170 of the memory device into the charge storage layer 150 through the multi-layer tunneling dielectric structure 160 by +FN tunneling so as to decrease the threshold voltage of the memory device. When the holes are injected from the gate 170 of the memory device into the charge storage layer 150 through the multi-layer tunneling dielectric structure 160, the electrons injected into the channel also inject into the charge storage layer 150 through the insulating layer 140, thus, along with the increase of time, the threshold voltage of the memory device will self converge instead of dropping drastically. The results shown in FIG. 5 are the results when the gate 170 is respectively supplied with biases of +14V, +15V, and +16V and the source/drain regions 102 and 104 are floated. The results in FIG. 5 show that all three different positive biases supplied cause the threshold voltage to increase and to self-converge after some time.

Figure 6:
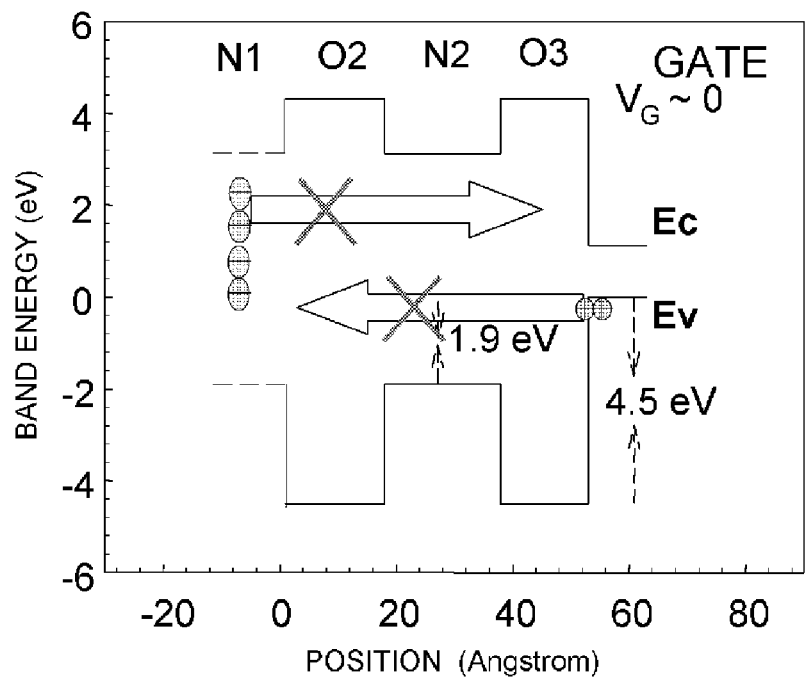
FIG. 6 is a theoretical band energy diagram of various layers of a memory cell at low electric field according to an embodiment of the present invention.
Figure 7:
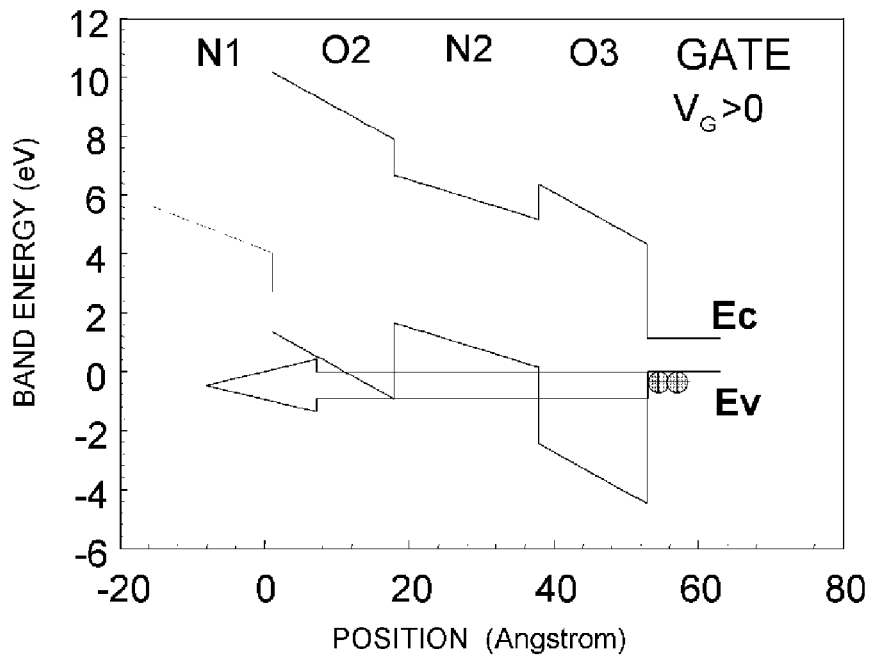
FIG. 7 is a theoretical band diagram of various layers of a memory cell at high electric field according to an embodiment of the present invention.

FIGS. 6 and 7 are theoretical band diagrams of injecting holes from the gate 170 of the memory device into the charge storage layer 150 (N1) through the multi-layer tunneling dielectric structure 160 (O2/N2/O3) by +FN tunneling in the present invention. FIG. 6 is the theoretical band diagram of supplying low electric field, namely, during the reservation period, and FIG. 7 is theoretical band diagram of supplying high electric field. Referring to FIG. 6, the multi-layer tunneling dielectric structure 160 is a O2/N2/O3 structure wherein each layer is less than or equal to 30 Å, and the multi-layer tunneling dielectric structure 160 can prevent holes from directly tunneling under low electric field and electrons from being de-trapped in the charge storage layer during the reservation period, thus, the multi-layer tunneling dielectric structure 160 has very good data reserving characteristic. Referring to FIG. 7, the multi-layer tunneling dielectric structure 160 is a O2/N2/O3 structure wherein each layer is less than or equal to 30 Å, and high efficiency hole tunneling can be performed under high electric field. This may be because that band offset can effectively urge holes overcoming tunneling barrier. Thus, the device in the present invention can provide fast hole programming/erasing, prevent hot hole induced damage caused by performing erasing operation to NROM device through band-to-band hot hole mechanism, and can prevent the conventional reservation problem of SONOS device.

The operations in the present invention described above can be applied to PMOS memory device and NMOS memory device.

First, the foregoing operations being applied to a PMOS memory device will be described. Referring to FIG. 2, when the foregoing operations are applied to a PMOS memory device and programming is performed, a negative bias is supplied to the gate 170 of the memory device and the p-type source/drain regions 102 and 104 are floated, grounded, or set to be 0V to form a depletion region in the channel region 106 between the p-type source/drain regions 102 and 104, and electrons injected from the gate 170 of the memory device into the charge storage layer 150 through tunneling the multi-layer tunneling dielectric structure 160 by −FN tunneling, so that the threshold voltage of the memory device is increased.

Referring to FIG. 4, when erasing is performed to the PMOS memory device, a positive bias is supplied to the gate 170 of the memory device, and the source/drain regions 102 and 104 are floated, grounded, or set to 0V, and holes injected from the gate 170 of the memory device into the charge storage layer 150 through tunneling the multi-layer tunneling dielectric structure 160 by +FN tunneling, so that the threshold voltage of the memory device is decreased.

Figure 8:
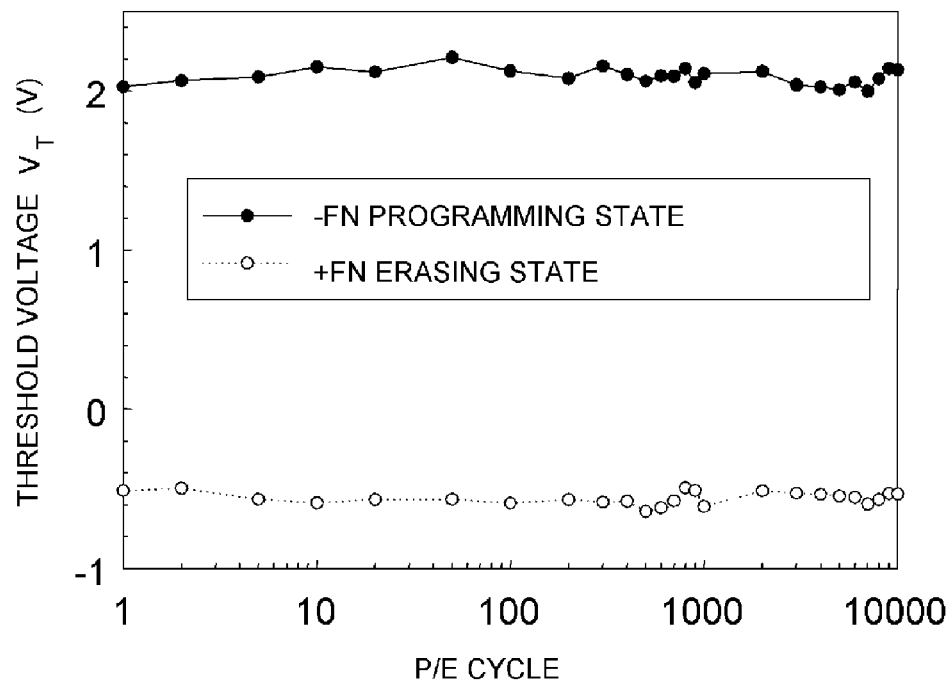
FIG. 8 is a diagram illustrating the relationship between the threshold voltage of a PMOS memory cell and time in programming state and erasing state after 10000 programming/erasing cycles (P/E cycles).
Figure 9:
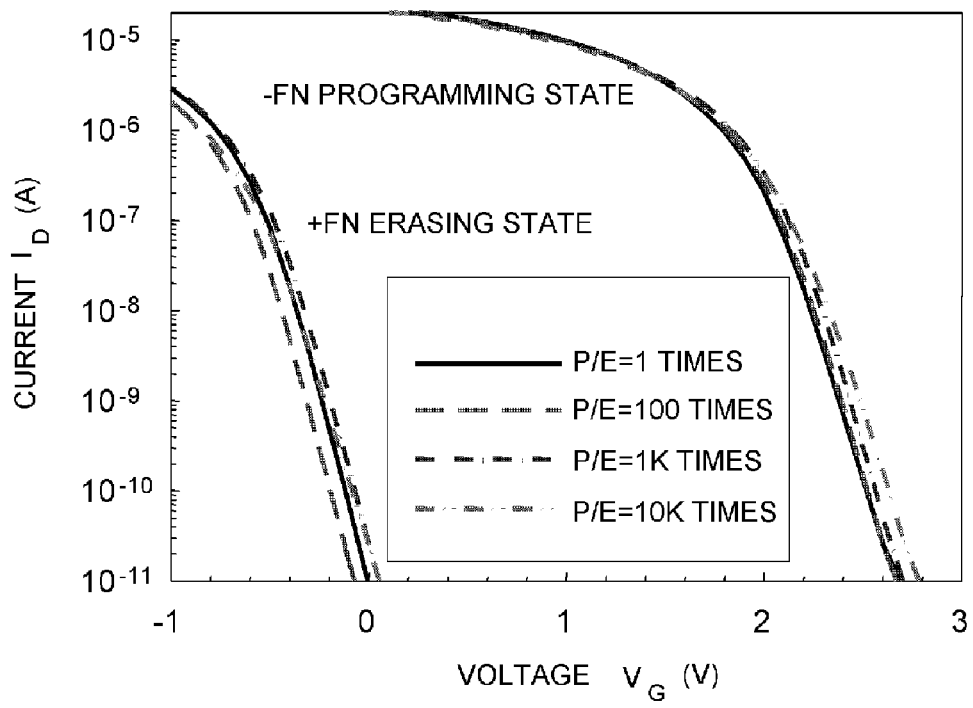
FIG. 9 is a diagram illustrating the relationship between read voltage $V_G$ and current $I_D$ of a PMOS memory cell in programming state and erasing state after 10000, 1000, 100, and 1 P/E cycles.

The device in the present invention also represents very excellent endurance to programming/erasing cycles. FIG. 8 is a diagram illustrating the relationship between the threshold voltage of a PMOS memory cell and time in programming state and erasing state after 10000 P/E cycles. As shown in FIG. 8, after 10000 P/E cycles, the change of the threshold is not obvious. FIG. 9 is a diagram illustrating the relationship between read voltage $V_G$ and current $I_D$ of a PMOS memory cell in programming state and erasing state after 10000, 1000, 100 P/E cycle, and 1 P/E cycle. As shown in FIG. 9, the change of the current $I_D$ is not obvious after 10000 P/E cycles.

Next, the situation of the foregoing operations being applied to an NMOS memory device will be described. Referring to FIG. 4, when the foregoing programming operation is applied to an NMOS memory device, a positive bias is supplied to the gate 170 of the memory device and the source/drain regions 102 and 104 are set to be floating, grounded, or 0V to form a depletion region in the channel region 106 between the n-type source/drain regions 102 and 104, so that holes are injected from the gate of the memory device into the charge storage layer 150 through the multi-layer tunneling dielectric structure 160 by +FN tunneling, which causes the threshold voltage of the memory device to decrease.

Referring to FIG. 2, when the NMOS memory device is being erased, a negative bias can be supplied to the gate of the memory device and the n-type source/drain regions 102 and 104 are floated, grounded, or set to 0V, so that electrons injected from the gate of the memory device into the charge storage layer 150 through the multi-layer tunneling dielectric structure 160 by −FN tunneling, which causes the threshold voltage of the memory device to increase.

Figure 10:
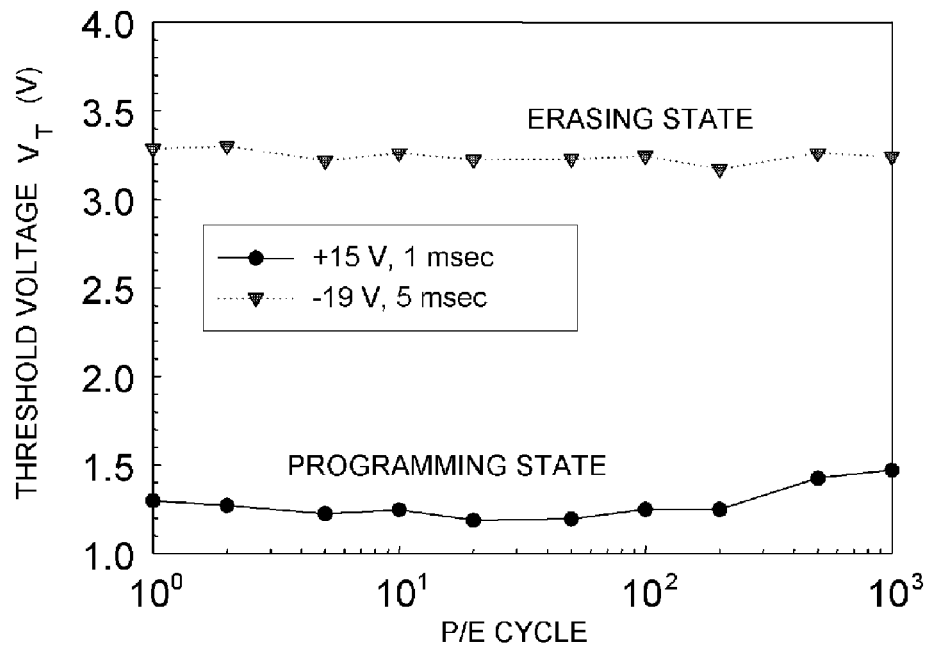
FIG. 10 is a diagram illustrating the relationship between the threshold voltage of a NMOS memory cell and time in programming state and erasing state after 10000 P/E cycles.
Figure 11:
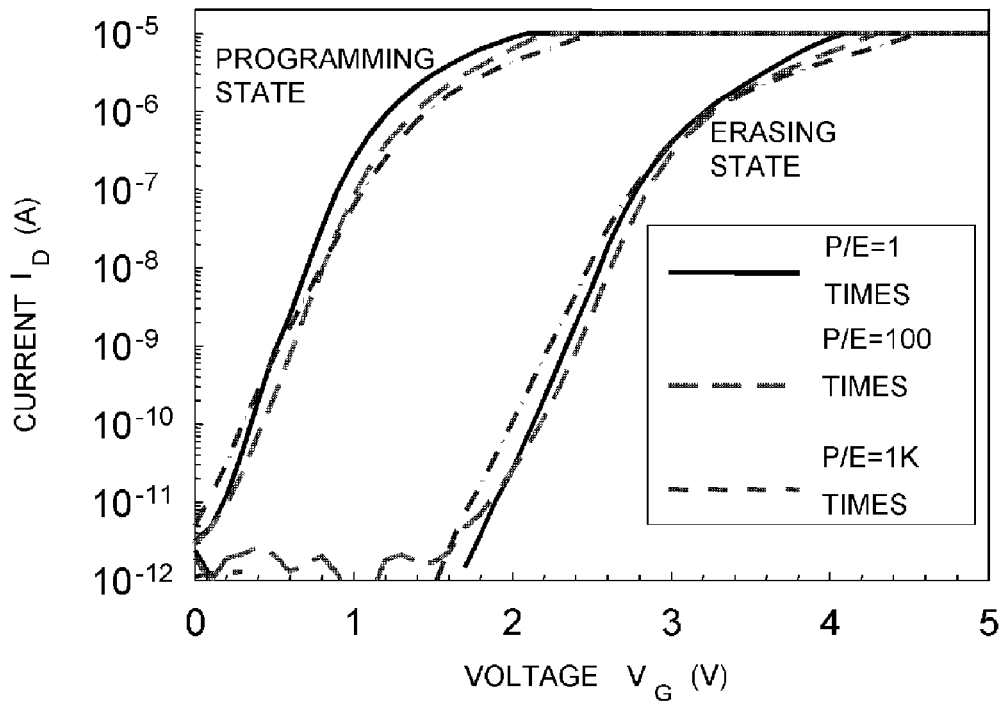
FIG. 11 is a diagram illustrating the relationship between read voltage $V_G$ and current $I_D$ of a NMOS memory cell in programming state and erasing state after 10000, 1000, 100, and 1 P/E cycles.

The device in the present invention also represents excellent endurance to programming/erasing cycles (P/E cycles). FIG. 10 is a diagram illustrating the relationship between the threshold voltage of a NMOS memory cell and time in programming state and erasing state after 10000 P/E cycles. As shown in FIG. 10, the change of the threshold voltage after 10000 P/E cycles is not obvious. FIG. 11 is a diagram illustrating the relationship between read voltage $V_G$ and current $I_D$ of a NMOS memory cell in programming state and erasing state after 10000, 1000, 100, and 1 P/E cycles. As shown in FIG. 11, after 10000 P/E cycles, the change of the current $I_D$ is not obvious.

In an embodiment of the present invention, the gate 170 corresponds to the word line of the memory array, and the source 102 and the drain 104 (or in reverse, the source 104 and the drain 102) correspond to the bit lines of the memory array. Thus, each memory cell has a corresponding word line and a pair of corresponding bit lines, or referred to as the first bit line and the second bit line. In some more exemplary embodiments of the present invention, the gate 170 corresponds to a word line of the memory array, and the source 102 and the drain 104 (or in reverse, the source 104 and the drain 102) correspond to two adjacent diffusion regions of a discontinuous bit line.

It is well-known that MOS structure is symmetrical, while source and drain are exchangeable in their functions. Thus, in the description above and below, and in any embodiment of the present invention, the source and the drain of a memory cell, or the first and the second bit lines of an array are exchangeable without affecting the functions of the cell, array, or scope of the present invention. In other words, a particular diffusion region can be used as a source or a drain in a particular cell according to the voltage applied thereto, and this is well understood by those skilled in the art.

Figure 12:
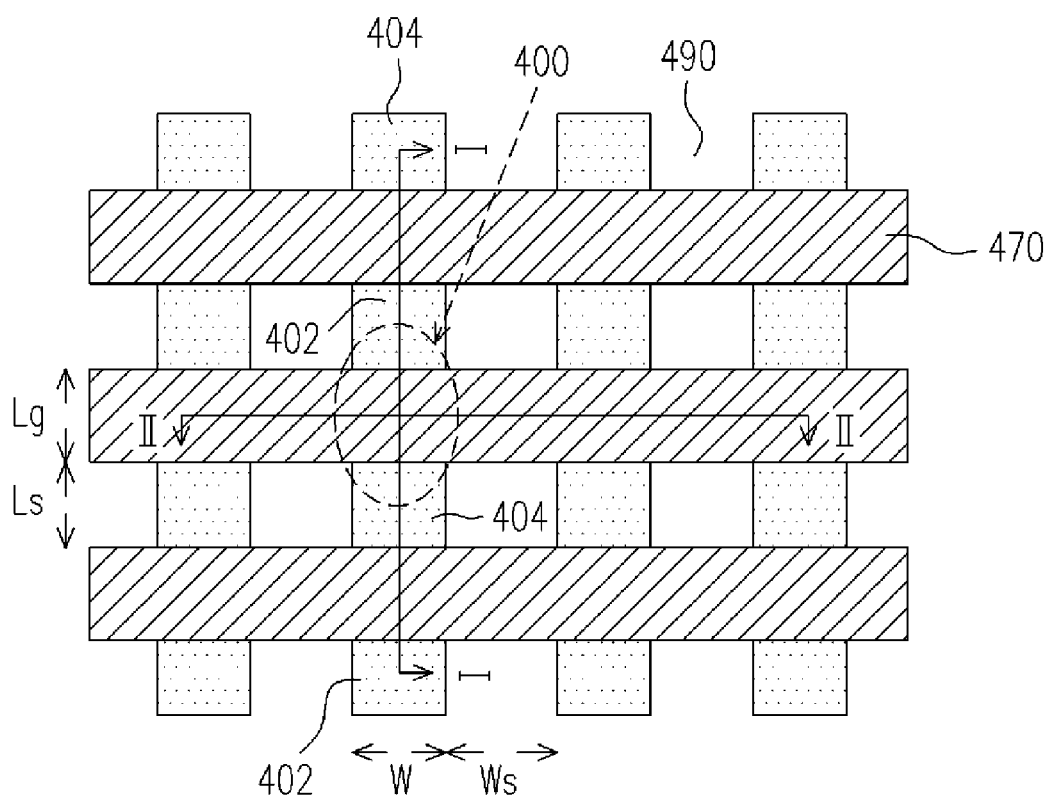
FIG. 12 is a top view of a memory array according to an embodiment of the present invention.
Figure 13:
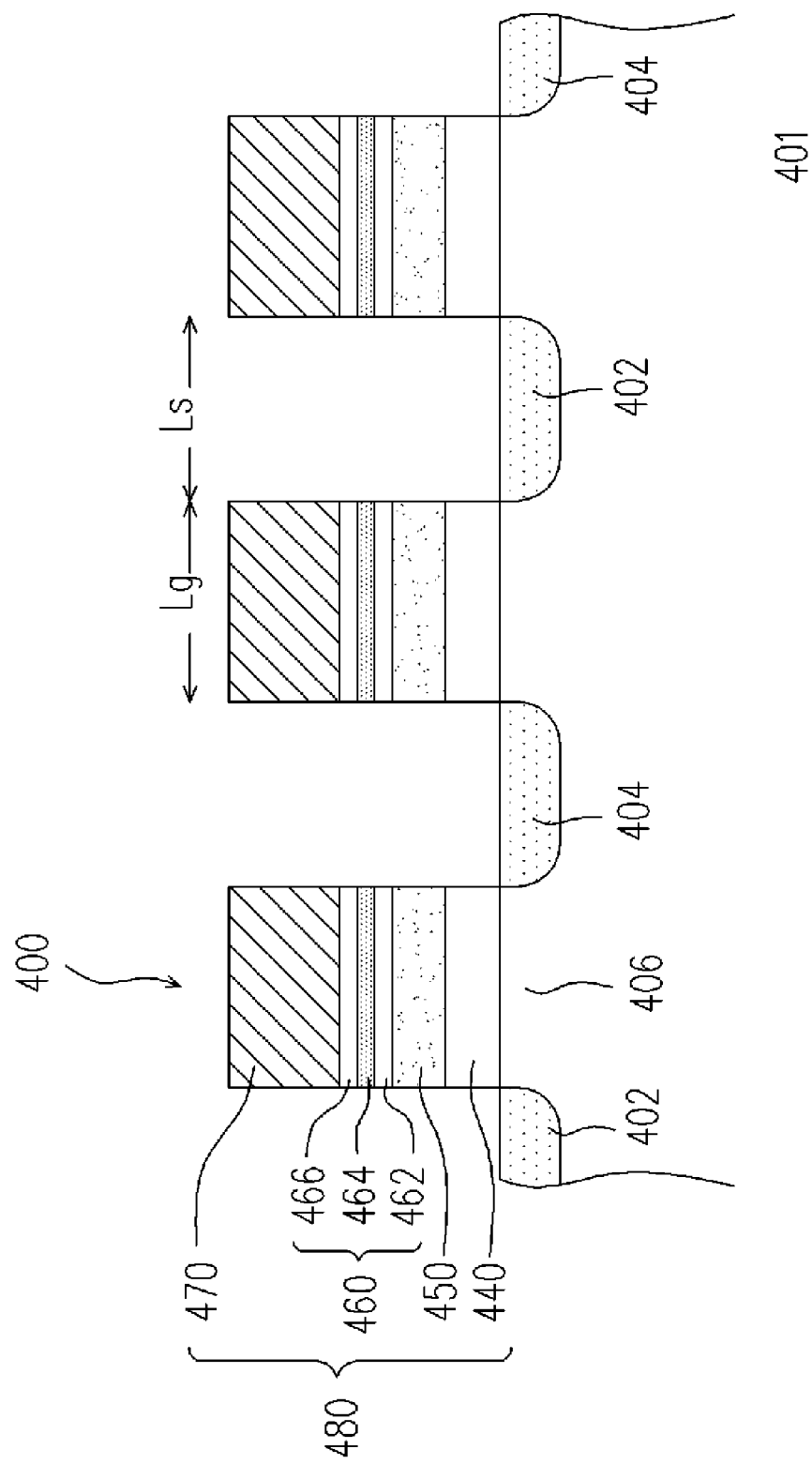
FIG. 13 is a cross-sectional view of a part of the array cutting along channel length direction I-I in FIG. 12.
Figure 14:
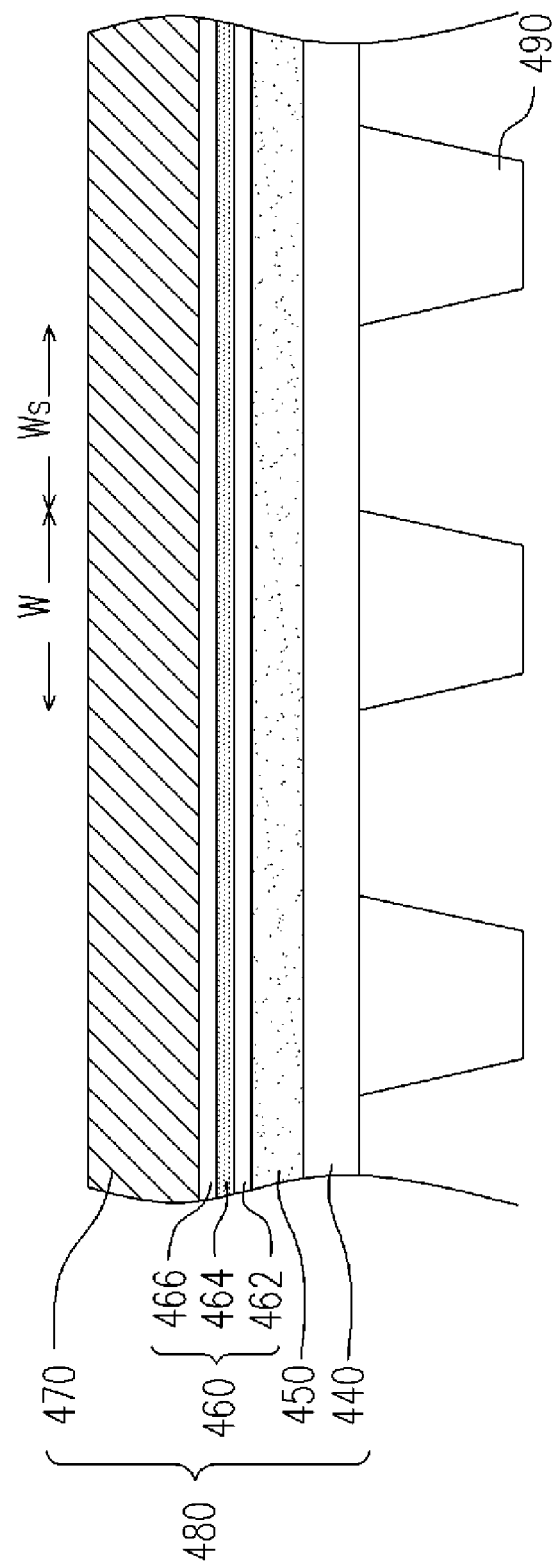
FIG. 14 is a cross-sectional view of a part of the array cutting along channel width direction II-II in FIG. 12.

FIGS. 12~14 illustrate memory arrays according to exemplary embodiment of the present invention. FIG. 12 illustrates a memory structure which has a plurality of discontinuous bit lines (vertical) and a plurality of word lines (horizontal). FIG. 13 is a cross-sectional view of a part of the array cutting along channel length direction I-I in FIG. 12. FIG. 14 is a cross-sectional view of a part of the array cutting along channel width direction II-II in FIG. 12.

Referring to FIGS. 12~14, the memory structure has diffusion regions (S/D) 402 and 404 which can be used as the source and the drain. The diffusion regions 402 and 404 are formed in the substrate 401 under the word lines. A plurality of channel regions 406 are disposed between the two adjacent diffusion regions 402 and 404 of the same discontinuous bit line. The shallow trench isolation 490 in the substrate 401 is used for separating the transistor regions. The depth of the trench is between 100 nm and 400 nm. Lg represents channel length. Ls refers to the space between memory cells. W is channel width, and Ws is the width of the shallow trench isolation (STI). The stack layer 480 of the substrate 401 includes an insulating layer 440, a charge storage layer 450, a multi-layer tunneling dielectric structure 460, and a gate 470, wherein the multi-layer tunneling dielectric structure 460 includes a first tunneling dielectric layer 462, a small hole tunneling barrier height layer 464, and a second tunneling dielectric layer 466.

Figure 15:
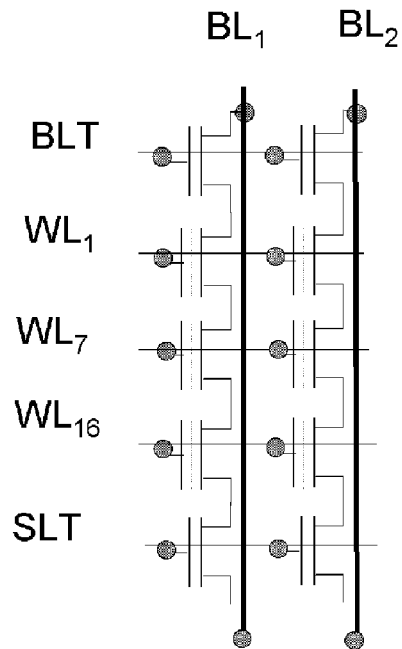
FIG. 15 is an equivalent circuit diagram of a memory array according to an embodiment of the present invention.

FIG. 15 is an equivalent circuit diagram of a memory array according to an exemplary embodiment of the present invention. The intersection of each word line (WL) and two adjacent bit lines (BL's) contains a transistor.

Next, operation to memory cell array according to different embodiments of the present invention will be described.

Figure 16:
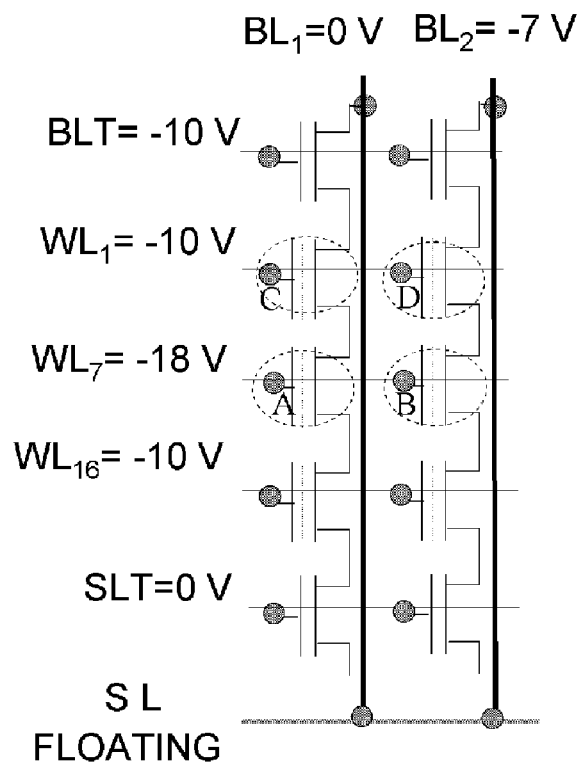
FIGS. 16 to 18 are respectively equivalent circuit diagrams of the programming, erasing, and reading operation of a p-channel NAND array structure in the present invention.
Figure 17:
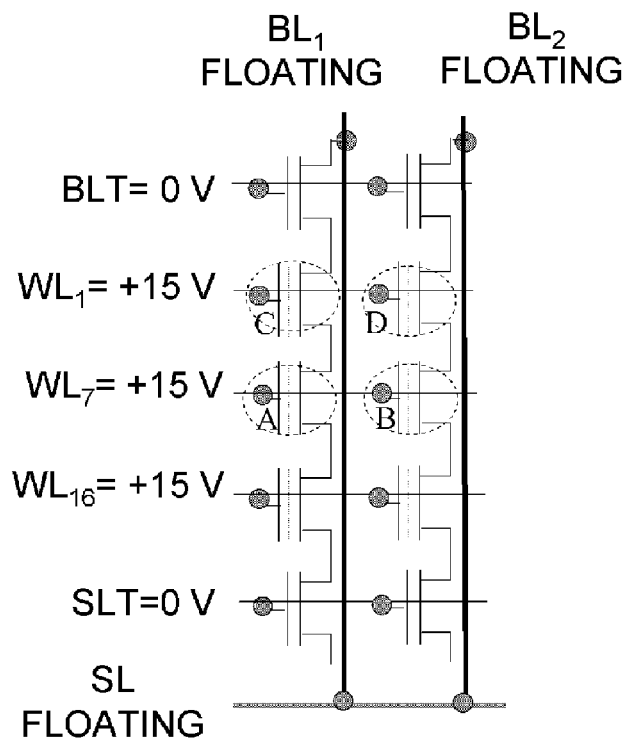
Figure 18:
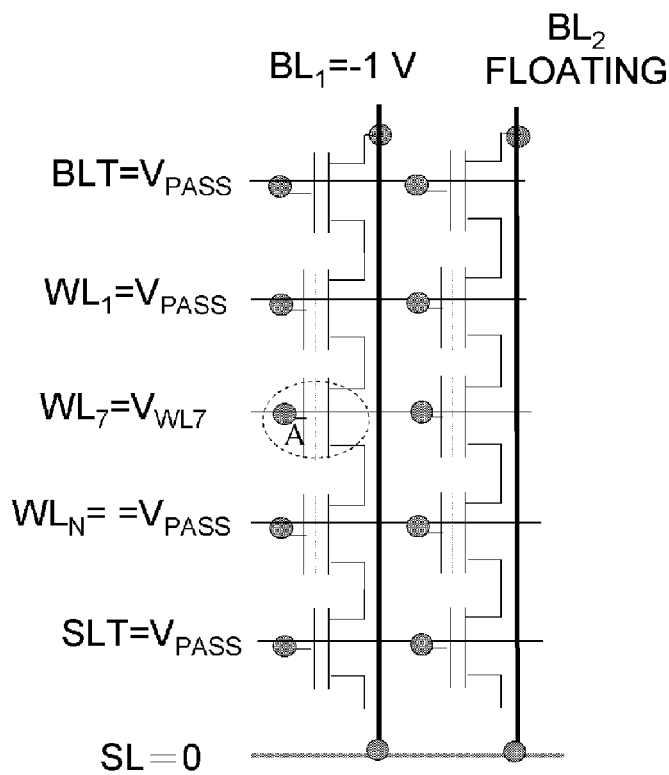

FIGS. 16~18 are equivalent circuit diagrams respectively illustrating the programming, erasing, and reading operation to a p-channel NAND array structure according to the present invention.

Referring to FIG. 16, according to an embodiment of the present invention, a negative bias is supplied to a word line corresponding to a selected memory cell to perform programming operation. In particular, a bias between about −16V and about −20V, preferably about −18V, is supplied to the word line $WL_7$ corresponding to the selected memory cell A, a bias of about −10V is supplied to other word lines, a bias of about 0V is supplied to the bit line $BL_1$ corresponding to the selected memory cell A, a bias of about −7V is supplied to the other bit line $BL_2$, and the source line SL is floated. The selective transistors (SLT and BLT) can exist selectively and are connected to the memory array. A bias of 0V is supplied to the selective transistor SLT close to the source line SL, and a bias of −10V is supplied to the selective transistor BLT far from the source line SL. Accordingly, a vertical strong electric field is formed under the word line $WL_7$. Under the strong electric field, electrons injected from the gate of the memory cell A into the charge storage layer through the multi-layer tunneling dielectric structure, so that the threshold voltage $V_{th}$ of the memory cell is increased. The interference of this operation to the adjacent memory cells B, C, and D is within an acceptable range.

Referring to FIG. 17, according to an embodiment of the present invention, a positive bias is supplied to the word line of the memory cell to perform erasing operation. In particular, a bias between about +14V and about +16V, preferably +15V, is supplied to all the word lines, and the source line SL and all the bit lines are floated. 0V bias is supplied to both the selective transistors SLT and BLT which are close to or far from the source line SL. Holes injected from the gates of various memory cells into the charge storage layer through the multi-layer tunneling dielectric structure by +FN tunneling, so that the threshold voltages of the memory cells are reduced, so as to achieve the purpose of erasing data.

Referring to FIG. 18, according to an embodiment of the present invention, a read operation is performed to a memory cell. In particular, a bias of about −1V is supplied to the bit line corresponding to the selected memory cell A, the other word lines are floated, and a bias of 0V is supplied to the source line SL. Moreover, a bias $V_{WL7}$ is supplied to the word line $WL_7$ corresponding to the selected memory cell A, and a bias $V_{pass}$ is supplied to all other word lines and the selective transistors SLT and BLT which are close to and far from the source line SL. An external sensing circuit (not shown) senses the current passing through the channel because of the bias difference between the source and the drain. Whether memory cell A has been programmed can be known from the current passing through memory cell A and sensed by the sensing circuit.

Figure 19:
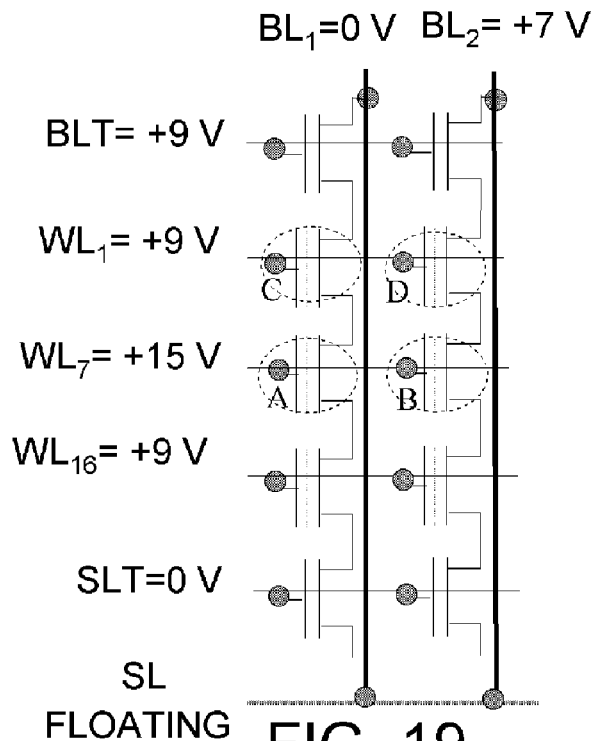
FIGS. 19 to 21 are respectively equivalent circuit diagrams of the programming, erasing, and reading operation of an n-channel NAND array structure in the present invention.
Figure 20:
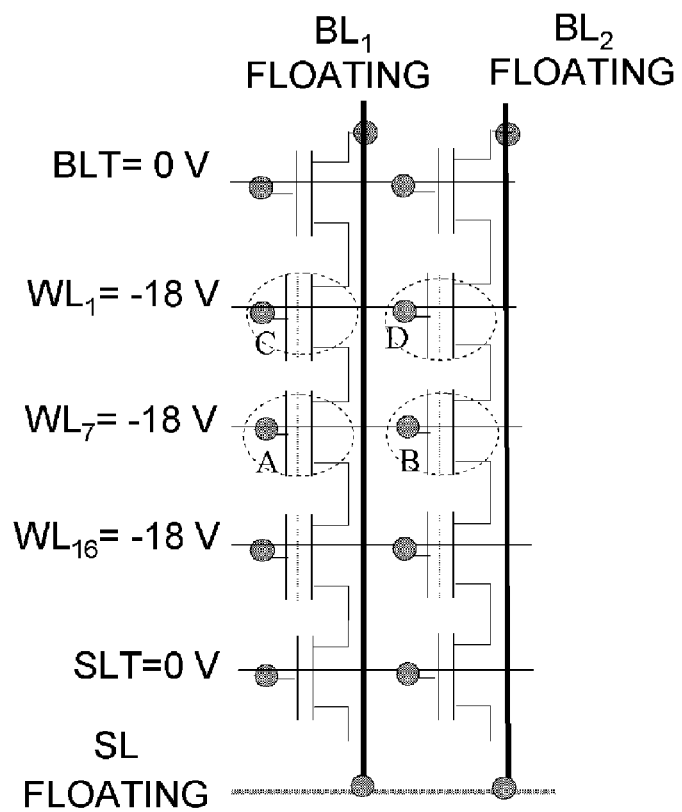
Figure 21:
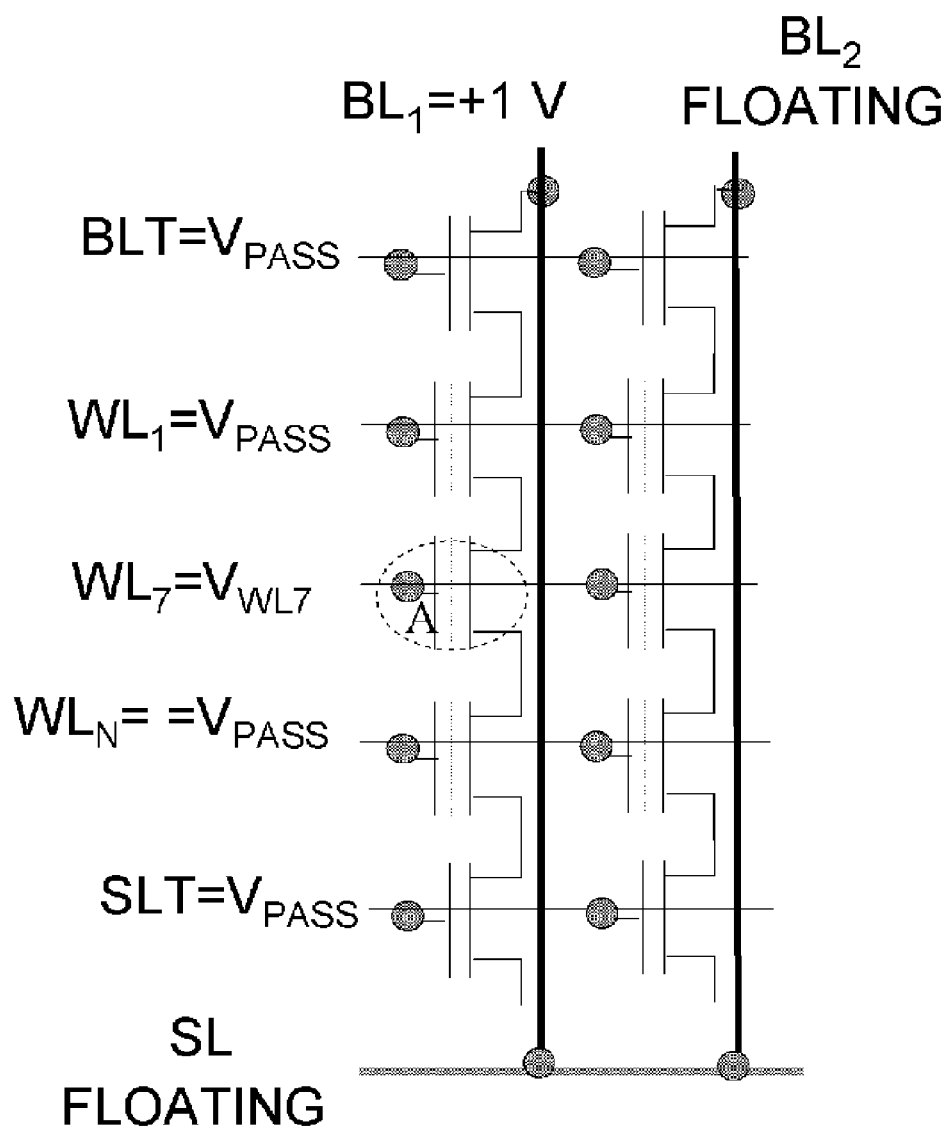

FIGS. 19~21 are respectively equivalent circuit diagrams of the programming, erasing, and reading operation of an n-channel NAND array structure in the present invention.

Referring to FIG. 19, according to an embodiment of the present invention, a positive bias is supplied to a word line corresponding to a selected memory cell for performing programming operation. In particular, a bias between about +14V and about +16V, preferably +15V, is supplied to the word line $WL_7$ corresponding to the selected memory cell A, a bias of about +9V is supplied to other word lines, a bias of about 0V is supplied to the bit line $BL_1$ corresponding to the selected memory cell A, a bias of about +7V is supplied to the other bit line $BL_2$, and the source line SL is floated. The selective transistors (SLT and BLT) exist selectively and are connected to the memory array. The selective transistor SLT close to the source line SL is supplied with a bias of 0V, and the selective transistor BLT far from the source line SL is supplied with a bias of +9V. Accordingly, a vertical strong electric field is formed under the word line $WL_7$. Under the strong electric field, holes injected from the gate of the memory cell A into the charge storage layer through the multi-layer tunneling dielectric structure by +FN tunneling, so that the threshold voltage $V_{th}$ of the memory cell is reduced. The interference of this operation to adjacent memory cells B, C, and D is within an acceptable range.

Referring to FIG. 20, according to an embodiment of the present invention, a negative bias is supplied to the word line of a memory cell to perform erasing operation. In particular, a bias between about −16V and about −20V, preferably about −18V, to all word lines, and the source line SL and all the bit lines are floated. A bias of 0V is supplied to the selective transistors SLT and BLT close to and far from the source line SL. Electrons injected from the gates of various memory cells into the charge storage layer through the multi-layer tunneling dielectric structure by −FN tunneling so that the threshold voltages of the memory cells are increase so as to achieve the purpose of erasing data.

Referring to FIG. 21, according to an embodiment of the present invention, a read operation is performed to a memory cell. In particular, a bias of about +1V is supplied to the bit line corresponding to the selected memory cell A, the other bit lines are floated, and a bias of 0V is supplied to the source line SL. Moreover, a bias $VWL_7$ is supplied to the word line $WL_7$ corresponding to the selected memory cell A, and a bias $V_{pass}$ is supplied to other word lines and the selective transistors SLT and BLT close to and far from the source line SL. An external sensing circuit (not shown) senses the current passing through the channel because of the bias difference between the source and the drain. Whether the memory cell A has been programmed can be known from the current passing through the memory cell A and sensed by the sensing circuit.

According to the present invention, the read current of the device has been estimated and is suitable for flash memory. A bias of +15V is supplied to the gate of a PMOS memory device or a bias of −18V is supplied to a NMOS memory device, the erasing of the well can be completed within 10 msec.

The tunneling oxidation layer does not directly cover the channel but is disposed on the charge storage layer on the insulating layer, thus, the tunneling oxidation layer is almost not affected by bird beak effect caused by shallow trench isolation structure, so that the reliability of the device can be improved effectively and the device can be minimized. Moreover, the device can be programmed or erased quickly without high voltage, thus, the operating method in the present invention is a method of low power consumption and high speed. Furthermore, since the main carrier current passes through the multi-layer tunneling dielectric structure under the gate instead of the insulating layer on the channel, the degradation of the device after many times of programming/erasing is very small.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operating method of a memory cell, the operating method comprising:
   providing a memory cell, the memory cell comprising:
      a substrate, having two source/drain regions being separated by a channel region disposed under a surface of the substrate;
      an insulating layer, disposed on the channel region;
      a charge storage layer, disposed on the insulating layer;
      a multi-layer tunneling dielectric structure, disposed on the charge storage layer; and
      a gate, disposed on the multi-layer tunneling dielectric structure;
   performing a first operation, supplying a negative bias to the gate and setting the source/drain regions to be floating, grounded, or 0V, injecting electrons from the gate of the memory cell into the charge storage layer through the multi-layer tunneling dielectric structure by −FN tunneling so as to increase the threshold voltage of the memory cell; and
   performing a second operation, supplying a positive bias to the gate and setting the source/drain regions to be floating, grounded, or 0V, injecting holes from the gate of the memory cell to the charge storage layer through the multi-layer tunneling dielectric structure by +FN tunneling so as to decrease the threshold voltage of the memory cell.

2. The operating method as claimed in claim 1, wherein the negative bias is between about −16V and about −20V.

3. The operating method as claimed in claim 1, wherein the positive bias is between about 14V and about 16V.

4. The operating method as claimed in claim 1, wherein the source/drain regions are p-type conductive, and the first operation is a programmed operation and the second operation is an erasing operation.

5. The operating method as claimed in claim 1, wherein the source/drain regions are n-type conductive, and the first operation is an erasing operation and the second operation is a programmed operation.

6. The operating method as claimed in claim 1, wherein the multi-layer tunneling dielectric structure comprises an oxide/nitride/oxide layer.

7. The operating method as claimed in claim 1, wherein the multi-layer tunneling dielectric structure comprises a silicon oxide/silicon nitride/silicon oxide layer or a silicon oxide/aluminum oxide/silicon oxide layer.

8. The operating method as claimed in claim 1, wherein the material of the insulating layer comprises silicon oxide or aluminum oxide.

9. The operating method as claimed in claim 1, wherein the material of the charge storage layer comprises silicon nitride, SiON, $HfO_2$, $HfSi_xO_y$, or $Al_2O_3$.

10. An operating method of memory device, wherein the memory device comprises a gate, a source region, a drain region, a channel region between the source region and the drain region, a charge storage layer disposed on the channel region, a multi-layer tunneling dielectric structure between the charge storage layer and the gate, and an insulating layer between the charge storage layer and the channel region, wherein the gate corresponds to a word line, the source region corresponds to a first bit line, and the drain region corresponds to a second bit line, the operating method comprising:
performing a first operation to a selected memory cell, supplying a negative bias to the word line, setting the first and the second bit lines to be floating, grounded, or 0V, injecting electrons from the gate of the memory cell to the charge storage layer through the multi-layer tunneling dielectric structure by −FN tunneling so as to increase the threshold voltage of the memory cell; and
performing a second operation to the selected memory cell, supplying a positive bias to the word line, setting the first and the second bit lines to be floating, grounded, or 0V, injecting holes from the gate of the memory cell to the charge storage layer through the multi-layer tunneling dielectric structure by +FN tunneling so as to decrease the threshold voltage of the memory cell.

11. The operating method as claimed in claim 1, wherein the negative bias is between about −16V and about −20V.

12. The operating method as claimed in claim 1, wherein the positive bias is between about 14V and about 16V.

13. The operating method as claimed in claim 10, wherein the source/drain regions are p-type conductive, and the first operation is a programmed operation and the second operation is an erasing operation.

14. The operating method as claimed in claim 10, wherein the source/drain regions are n-type conductive, and the first operation is an erasing operation and the second operation is a programmed operation.

15. The operating method as claimed in claim 10, wherein the multi-layer tunneling dielectric structure comprises an oxide/nitride/oxide layer.

16. The operating method as claimed in claim 10, wherein the multi-layer tunneling dielectric structure comprises a silicon oxide/silicon nitride/silicon oxide layer or a silicon oxide/aluminum oxide/silicon oxide layer.

17. The operating method as claimed in claim 10, wherein the material of the insulating layer comprises silicon oxide or aluminum oxide.

18. The operating method as claimed in claim 10, wherein the material of the charge storage layer comprises silicon nitride, SiON, $HfO_2$, $HfSi_xO_y$, or $Al_2O_3$.

* * * * *